US008168471B2

(12) United States Patent
Kanda et al.

(10) Patent No.: US 8,168,471 B2
(45) Date of Patent: May 1, 2012

(54) SEMICONDUCTOR DEVICE AND MANUFACTURING METHOD OF A SEMICONDUCTOR DEVICE

(75) Inventors: Takashi Kanda, Kawasaki (JP); Kenji Fukuzono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/712,604

(22) Filed: Feb. 25, 2010

(65) Prior Publication Data

US 2010/0151632 A1 Jun. 17, 2010

Related U.S. Application Data

(63) Continuation of application No. 11/526,100, filed on Sep. 25, 2006, now abandoned.

(30) Foreign Application Priority Data

Mar. 27, 2006 (JP) ................. 2006-086533

(51) Int. Cl.
H01L 21/44 (2006.01)
H01L 21/48 (2006.01)

(52) U.S. Cl. ........ 438/108; 438/124; 438/462; 438/622; 438/689; 257/701; 257/758; 257/774; 257/E21.502; 257/E21.503; 257/E21.705; 257/E23.062; 257/E23.172; 324/763

(58) Field of Classification Search .................. 438/108, 438/124, 462, 622, 689; 257/701, 758, 774, 257/E21.502, E21.503, E21.705, E23.062, 257/E23.172; 324/763
See application file for complete search history.

(56) References Cited

U.S. PATENT DOCUMENTS

| 6,919,226 B2 | 7/2005 | Ogawa et al. |
| 7,018,866 B2 | 3/2006 | Sugaya et al. |
| 7,161,371 B2 | 1/2007 | Higashitani et al. |
| 2009/0154132 A1 | 6/2009 | Okamoto et al. |

FOREIGN PATENT DOCUMENTS

| JP | 08-316641 | 11/1996 |
| JP | 2000-223837 | 8/2000 |
| JP | 2001-144212 A | 5/2001 |
| JP | 2002-359319 A | 12/2002 |
| JP | 2003-152152 A | 5/2003 |
| JP | 2005-340686 | 12/2005 |
| JP | 2005-340687 | 12/2005 |
| WO | WO-2007/043639 | 4/2007 |

OTHER PUBLICATIONS

USPTO, (Nguyen) Advisory Action, Dec. 16, 2009, in parent (section 120 priority) U.S. Appl. No. 11/526,100 [now abandoned].

(Continued)

*Primary Examiner* — Dao H Nguyen
(74) *Attorney, Agent, or Firm* — Fujitsu Patent Center

(57) ABSTRACT

A semiconductor device includes a multi-layer substrate and a semiconductor element mounted on the multi-layer substrate. The multi-layer substrate contains a plurality of circuit-formation layers joined by a first resin material. The semiconductor element is mounted on the multi-layer substrate by being joined to the multi-layer substrate by a second resin material. The first resin material and the second resin material are curable in the same heating condition.

6 Claims, 4 Drawing Sheets

OTHER PUBLICATIONS

USPTO, (Nguyen) Final Office Action, Aug. 25, 2009, in parent (section 120 priority) U.S. Appl. No. 11/526,100 [now abandoned].

USPTO, (Nguyen) Non-Final Action, Nov. 24, 2008, in parent (section 120 priority) U.S. Appl. No. 11/526,100 [now abandoned].

USPTO, (Nguyen) Restriction Requirement, Sep. 22, 2008, in parent (section 120 priority) U.S. Appl. No. 11/526,100 [now abandoned].

Japan Patent Office: Office Action mailed Nov. 24, 2010 in corresponding JP Patent Application No. 2006-086533, with partial English-language translation.

FIG.1
(a) 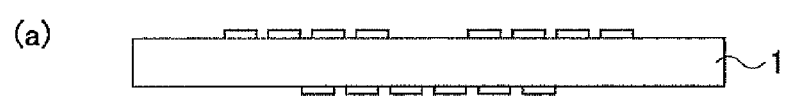
(b) 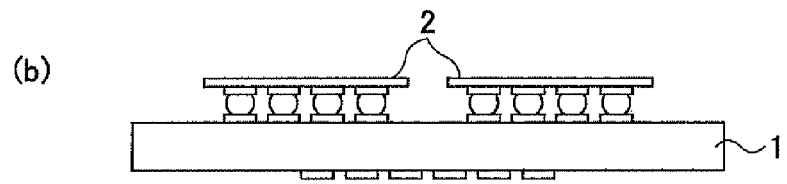
(c) 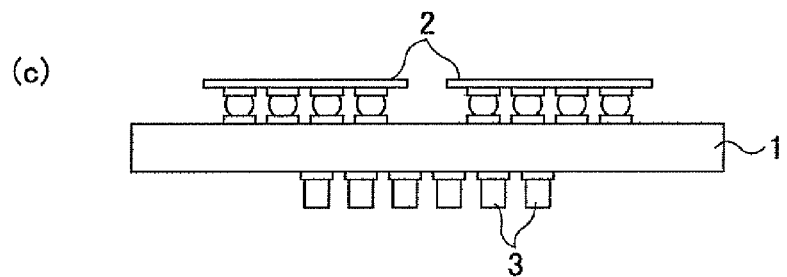
(d) 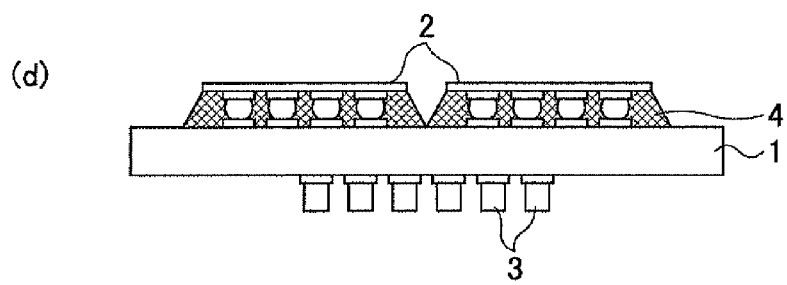
(e) 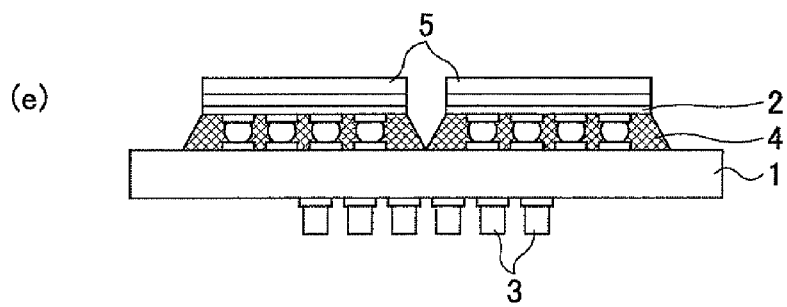

SEMICONDUCTOR DEVICE AND MANUFACTURING METHOD OF A SEMICONDUCTOR DEVICE

CROSS-REFERENCE TO RELATED APPLICATIONS

The present application is based on Japanese priority application No. 2006-086533 filed Mar. 27, 2006; and is a Divisional of prior application Ser. No. 11/526,100 filed on Sep. 25, 2006, the entire contents of both of the aforementioned applications are hereby incorporated by reference.

BACKGROUND OF THE INVENTION

1. Field of the Invention

The present invention relates to semiconductor devices and, more particularly, to a semiconductor device such as a chip module, which is formed by mounting a semiconductor chip onto a built-up substrate.

2. Description of the Related Art

Conventionally, a single-chip module or a multi-chip module is generally formed by mounting a semiconductor chip or a plurality of semiconductor chips onto a multi-layer substrate (also refereed to as a laminated circuit board) such as a built-up substrate. The built-up substrate can be manufactured, for example, by laminating circuit-pattern layers on both sides of a core substrate (for example, refer to Patent Document 1 and Patent Document 2). A chip module is manufactured by preparing such a built-up substrate and mounting one or a plurality of semiconductor chips and peripheral electronic parts onto the prepared built-up substrate.

In the manufacturing process of such a chip module, it is general that a process of preparing a built-up substrate and a process of mounting a semiconductor chip are separate processes. Here, an example of a manufacturing process of a conventional chip module is shown in FIG. 1.

In the manufacturing process shown in FIG. 1, a built-up substrate 1 having wirings formed therein and a surface on which electrodes for connecting a semiconductor chip and electronic parts such as passive elements are formed (FIG. 1-(a)). Then, a semiconductor chip 2 is mounted on the prepared built-up substrate 1 (FIG. 1-b)). In the example shown in FIG. 1, semiconductor chips 2 having solder bumps are flip-chip mounted onto one side of the built-up substrate 1, and the solder bumps are melted by a reflow process. After mounting the semiconductor chips 2 onto the built-up substrate 1, chip parts 3 such as capacitors are mounted onto a backside of the built-up substrate 1 (FIG. 1-(c)). Also in this process, the chip parts 3 are mounted by reflowing solder. Then, an under-fill 4 is filled between each of the mounted semiconductor chips 2 and the built-up substrate 1 and the under fill 4 is cured by heating so as to fix the semiconductor chips 2 onto the built-up substrate 1 (FIG. 1-(d)). After curing the under-fill 4, a heat spreader 5 is mounted onto a backside of each of the semiconductor chips 2 via an adhesive and the adhesive is cured by heating so as to fix the heat spreader 5 onto each of the semiconductor chips 2 (FIG. 1-(e)).

In the above-mentioned manufacturing process, a manufacturer of the built-up substrate 1 usually differs from a manufacturer of the chip module in many cases. That is, in many cases, the built-up substrate 1 manufactured by the process of FIG. 1-(a) is conveyed to another place after being manufactured so as to be supplied to the process of FIG. 1-(b). Moreover, although the manufacturing process shown in FIG. 1-(b) through FIG. 1-(e) includes heating processes such as a heat-curing process of the under-fill 4 and a heat-curing process of the adhesive, the heating processes are separate processes from each other.

As mentioned above, many processes are included in the manufacturing process of the conventional chip module as shown in FIG. 1.

On the other hand, there is suggested a technique to form a chip module by embedding a semiconductor chip into a built-up substrate (for example, refer to Patent Document 3 and Patent Document 4). In order to embed a semiconductor chip into a built-up substrate, a process of mounting a semiconductor chip onto a substrate must be contained in a manufacturing process of the built-up substrate.

Patent Document 1: Japanese Laid-Open Patent Application No. 2005-340686
Patent Document 2: Japanese Laid-Open Patent Application No. 2005-340687
Patent Document 3: Japanese Laid-Open Patent Application No. 2000-223837
Patent Document 4: Japanese Laid-Open Patent Application No. 8-316641

As mentioned above, there is a method of manufacturing a chip module in which, after manufacturing a built-up substrate, a semiconductor chip is mounted onto the built-up substrate in a separate process. In this method, the substrate-manufacturing process and the chip-mounting process are separate processes, and, thus, there is a problem in that a number of processes to finally complete a chip module is large and it takes a time to complete the chip module.

On the other hand, the mounting process of a semiconductor chip can be included in the substrate manufacturing process by embedding the semiconductor chip in a built-up substrate. However, if the semiconductor chip is embedded in a built-up substrate, heat radiation from the semiconductor chip is restricted since the semiconductor chip is covered by an insulating layer and an adhesive layer of the substrate. Additionally, even if a hat spreader for cooling the semiconductor chip is provided, the heat spreader itself is embedded in the substrate, which prevents the semiconductor chip from radiating heat. Therefore, it is difficult to embed a semiconductor chip generating a large amount of heat such as a CPU, and the semiconductor chip embedded in the substrate is limited to a relatively small-size semiconductor chip generating a small amount of heat.

SUMMARY OF THE INVENTION

It is a general object of the present invention to provide a novel and improved semiconductor device in which the above-mentioned problems are eliminated.

A more specific object of the present invention is to provide a semiconductor device and a manufacturing method of a semiconductor device which can reduce a number of manufacturing processes by simultaneously performing processes relating to heat-curing of resin when manufacturing the semiconductor device.

In order to achieve the above-mentioned objects, there is provided according to one aspect of the present invention a semiconductor device comprising: a multi-layer substrate containing a plurality of circuit-formation layers joined by a first resin material; and a semiconductor element mounted on the multi-layer substrate by being joined to the multi-layer substrate by a second resin material, wherein the first resin material and the second resin material are curable in the same heating condition.

In the semiconductor device according to the present invention, the first resin material and the second resin material may be made of the same resin. The semiconductor device according to the present invention may further comprise a heat radiation member joined to the semiconductor element by a third resin material, wherein the third resin material may be made of a resin curable in the same heating condition as the first and second resin materials. The third resin material may be made of the same resin as the first and second resin materials.

In the semiconductor device according to the present invention, each of the first resin material and the second resin material may be formed of an insulating resin and an electrically conductive resin embedded in the insulating resin, and electrodes of the semiconductor element may be joined to electrodes of the multi-layer substrate by the electrically conductive resin. The semiconductor device according to the present invention may further comprise a heat radiation member joined to the semiconductor element by a third resin material, wherein the third resin material may be made of the same resin as the electrically conductive resin of the first and second resin materials. The electrically conductive resin may contain electrically conductive particles dispersed in a base resin material and solder diffused in the base material.

Additionally, there is provided according to another aspect of the present invention a manufacturing method of a semiconductor device having a semiconductor element mounted on a multi-layer substrate, comprising: preparing the multi-layer substrate by arranging a first resin material of a sheet shape between a plurality of circuit-formation layers and forming a laminated member by arranging the semiconductor element on the multi-layer substrate via a second resin material of a sheet shape; and curing the first and second resin materials by heating while pressurizing the laminated member so as to simultaneously join the circuit-formation layers to each other and the semiconductor element.

The manufacturing method according to the present invention may include: arranging a heat radiation member on the semiconductor element of the laminated member via a third resin material; and curing the third resin material simultaneously when heating the laminated member so as to join the heat radiation member to the semiconductor element. The manufacturing method according to the present invention may include: forming the first resin material by filling an electrically conductive resin in openings formed in an insulating resin of a sheet shape at positions corresponding to electrodes of the circuit-formation layer; and forming the second resin material by filling an electrically conductive resin in openings formed in an insulating resin of a sheet shape at positions corresponding to electrodes of the semiconductor element. The electrically conductive resin may be formed of a base resin and electrically conductive particles dispersed in the base resin, and a metal film may be formed on a surface of each of the electrically conductive particles. The electrically conductive particles may be metal particles, and the metal film may be a solder film.

According to the present invention, a number of manufacturing processes can be reduced by simultaneously performing the heating process for forming the multi-layer substrate and the heating process for mounting the semiconductor element. As a result, a manufacturing cost of the semiconductor device can be reduced.

Other objects, features and advantages of the present invention may become more apparent from the following detailed description when read in conjunction with the accompanying drawings.

BRIEF DESCRIPTION OF THE DRAWINGS

FIG. 1 is an illustration showing an example of a manufacturing process of a conventional chip module;

DETAILED DESCRIPTION OF THE PREFERRED EMBODIMENTS

A description will now be given, with reference to the drawings, of an embodiment of the present invention.

In the embodiment of the present invention, manufacturing processes of semiconductor devices, which have been performed separately, are performed at once. The conventional manufacturing process of semiconductor devices contains a heating process for curing an adhesive or an under-fill by heating. Additionally, in many cases, a manufacturing process of a laminated substrate such as a built-up substrate includes a process of joining a circuit-formation substrate by a resin material by heating. Thus, according to the present embodiment, the above-mentioned separate heating processes are performed simultaneously at once so that the separate heating processes are performed in a single heating process. Thereby, a number of processes relating to manufacture of a semiconductor is reduced, which reduces a cost of the semiconductor device.

In an embodiment of the present invention, a manufacturing process of a built-up substrate, which is a laminated substrate or a multi-layer substrate, and a mounting process of a semiconductor chip to the built-up substrate are performed at once. In order to achieve that, in the manufacture of the built-up substrate, a method of laminating a built-up layer, which is a circuit-formation layer, to a core substrate is used. By using an electrically conductive paste, which is curable by heating, so as to join electrodes of the built-up substrate and the core substrate to each other, the joining of the electrodes is performed by heating the electrically conductive paste.

Figure 2:
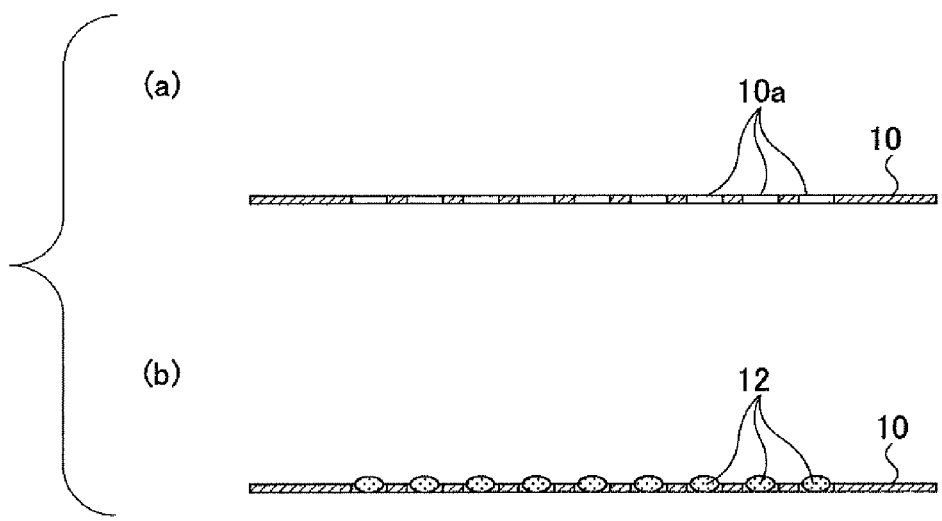
FIG. 2 is an illustration showing a method of forming an adhesive sheet provided with a conductive paste.

Here, a description will be given, with reference to FIG. 2, of a method of supplying an electrically conductive paste used for joining electrodes of a built-up layer of a built-up substrate. FIG. 2 is an illustration showing a method of forming an adhesive sheet provided with an electrically conductive paste.

As shown in FIG. 2-(*a*), apertures 10*a* are formed in an insulating adhesive sheet 10 at positions corresponding to electrodes to be joined. For example, the insulating adhesive sheet 10 is processed by press-punching so as to form the apertures 10*a* at once. After forming the apertures 10*a*, an electrically conductive paste 12 for joining electrodes to each other is filled in the apertures 10*a*, as shown in FIG. 2-(*b*). It is preferable to fill the electrically conductive paste 12 using a print method. The electrically conductive paste 12 is retained within the apertures 10*a* due to viscosity and adhesion of the electrically conductive paste 12. Accordingly, the electrically conductive paste 12 is integrated with the insulating adhesive sheet 10 and can be handled and conveyed as a single part. Additionally, positioning of the electrically conductive paste 12 to the electrodes can be performed by merely positioning the insulating adhesive sheet 10 to the built-up layer.

The insulating adhesive sheet 10 is made from a thermosetting insulating resin such as epoxy resin or the like so as to join the built-up layers to each other while insulating them. By inserting the insulating adhesive sheet 10 having the electrically conductive paste 12 between the built-up layers, which constitute a built-up substrate, the electrically conductive paste 12 is arranged at positions of the electrodes to be joined while being connected electrically and the insulating resin is arranged in other portions. Accordingly, by heating the insulating adhesive sheet 10 between the built-up layers, the built-up layers are joined to each other simultaneously by the electrical conductive paste 12. Hereinafter, the insulating adhesive sheet 10 provided with the electrically conductive paste 12 may be referred to as an adhesive sheet of a resin material.

The electrically conductive paste 12 can be made of, for example, a thermosetting epoxy resin as a base resin and mixing and dispersing electrically conductive particles in the base resin. For example, metal particles such as particles or filler of cupper may be used as the electrically conductive particles, and the metal particles or filler may be coated by plating tin-bismuth based solder (Sn—Bi solder: melting point 138° C.). As the epoxy resin, for example, a resin curable at a temperature of about 150° C. may be used. According to such a combination, the solder of a melting pint of 138° C. dispersed into the base resin when curing the resin at 150° C., which can provide excellent electrical conductivity. Once the base resin is cured, the dispersed solder is maintained to be in the dispersed state, and the electrically conductive paste after being cured can maintain an excellent electrical conductivity.

In the present embodiment, the built-up substrate is formed using the above-mentioned adhesive sheet and a semiconductor chip is mounted on the built-up substrate to be formed and a heat spreader is also joined simultaneously.

Figure 3:
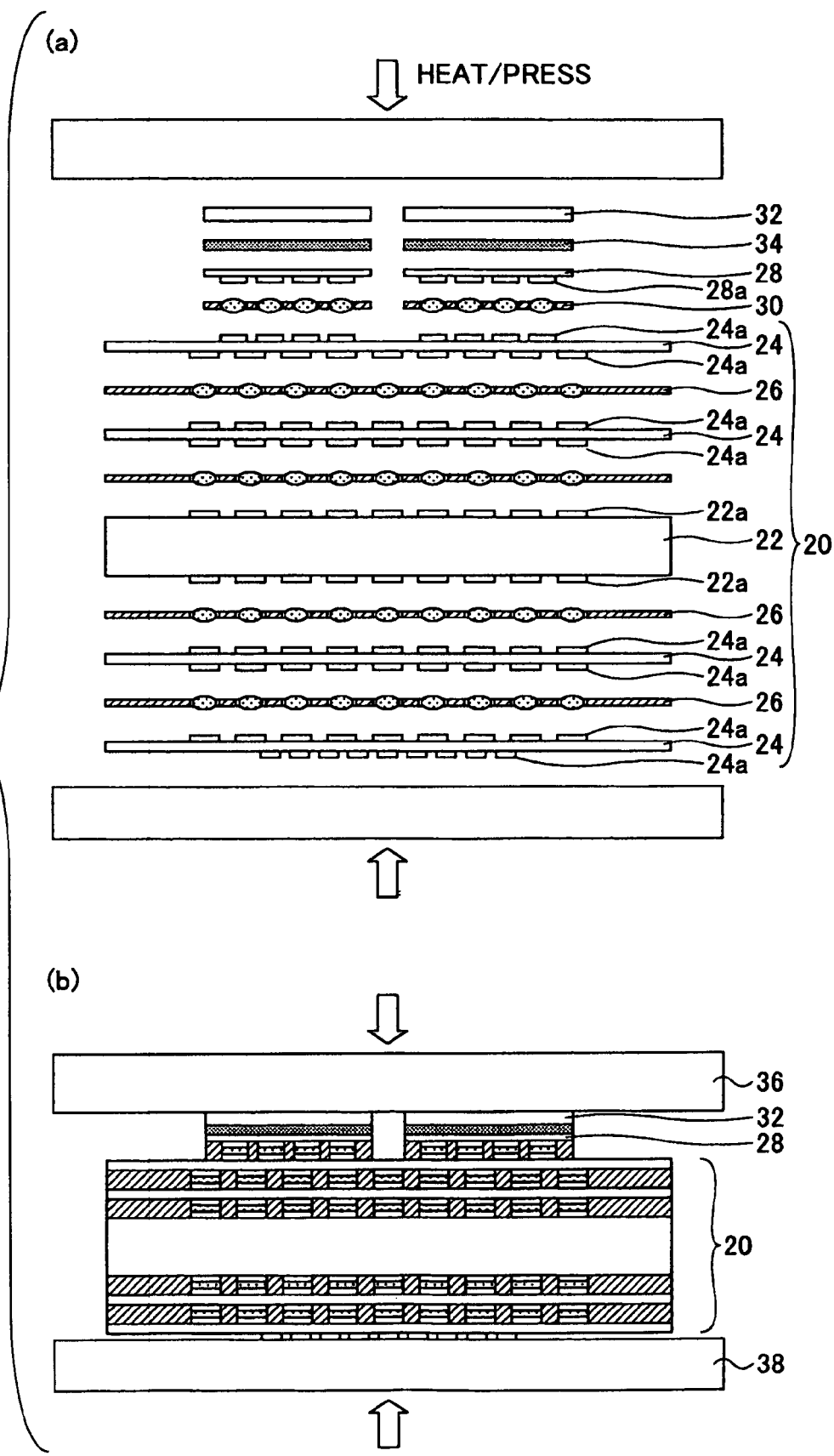
FIG. 3 is an illustration showing a manufacturing method of a multi-chip module according to an embodiment of the present invention.
Figure 4:
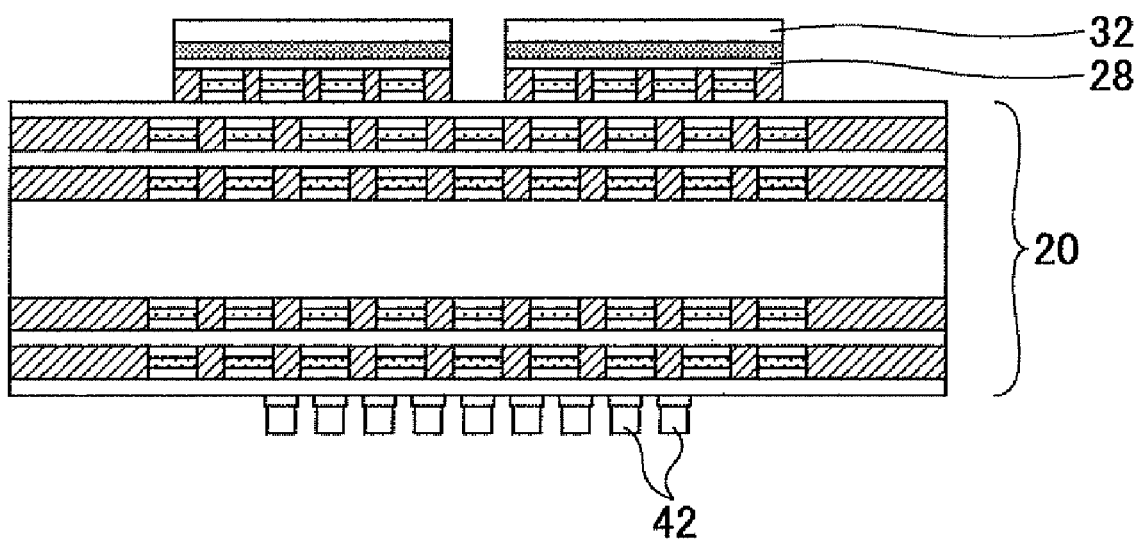
FIG. 4 is a cross-sectional view of the multi-chip module according to the embodiment of the present invention.

Next, a description will be given, with reference to FIG. 3 and FIG. 4, of a manufacturing method of a multi-chip module as a semiconductor device according to the present embodiment. FIG. 3 is an illustration showing the manufacture method of the multi-chip module according to the present embodiment. FIG. 4 is a cross-sectional view of the multi-chip module manufactured by the method shown in FIG. 3.

First, as shown in FIG. 3-(a), all parts constituting the multi-chip module are positioned and stacked. The parts constituting the multi-chip module include a core substrate 22 constituting a built-up substrate 20, built-up layers 24 which are circuit-formation layers laminated on the core substrate 22, adhesive sheets 26 which are first resin materials for joining the core substrate 22 and the built-up layers 24, the adhesive sheets 26 which are the first resin materials for joining the built-up layers 24 to each other, an adhesive sheet 30 which is a second resin material for fixing semiconductor chips 28 to the built-up substrate 20, a heat spreader 32, and an adhesive paste 34 for joining the heat spreader 32 to the semiconductor chips 28.

The core substrate 22 is a substrate which is a core of the built-up substrate 20, and is formed of, for example, a BT resin, a glass-epoxy or the like. Electrodes 22a are formed on a surface of the core substrate 22. The built-up layer 24 is a circuit-formation layer having electrodes 24a formed on upper and lower surfaces thereof, which are connected by wirings and vias. The adhesive sheet 26 as the first resin material is an adhesive sheet having a structure shown n FIG. 2-(b), and is provided with the electrically conductive paste 12 at positions corresponding to the electrodes 22a of the core substrate 22 and the electrodes 24a of the built-up layer 24. The built-up substrate 20 is formed by the core substrate 22, the built-up layers 24 and the adhesive sheets 26 joining them. It should be noted that core substrate 22 is not always necessary, and the built-up substrate 20 may be formed by laminating only the built-up layers 24.

On the uppermost built-up layer 24, the two semiconductor chips 28 are arranged via the adhesive sheets 30. Each adhesive sheet 30 as the second resin material is an adhesive sheet having the structure shown in FIG. 2-(b), and the electrically conductive paste 12 is provided at positions corresponding to electrodes 28a of the semiconductor chip 28 and electrodes 24a of the built-up layer 24.

On each semiconductor device 28, the heat spreader 32 is arranged via the adhesive paste 34. The heat spreader 32 is formed of a heat transfer material of a plate or film form. The heat spreader 32 is mounted to the semiconductor chip 28 as a heat radiation member for radiating heat generated in the semiconductor chip 28.

The adhesive paste 34 is an adhesive provided to join the heat spreader 32 to the semiconductor chip 28. The adhesive paste 34 is made of a heat transfer resin (a resin containing heat a transfer material to raise heat transfer performance). The adhesive paste 34 may be applied on a backside of the semiconductor chip 28, or may be a sheet material having the same shape as the semiconductor chip 28. The above-mentioned electrically conductive paste 12 is a resin mixed with metal particles to provide electrical conductively to the resin, and the electrically conductive paste 12 also provides excellent heat transfer performance due to the metal particles. Thus, the electrically conductive paste 12 may be used as the adhesive paste 34.

As mentioned above, after positioning and stacking the component parts of the multi-chip module, the lamination is sandwiched between an upper heating plate 36 and a lower heating plate 38 of a vacuum press machine so as to heat the lamination while pressing. The heating under vacuum is to prevent bubbles from generating in the resin when the resin is softened and cured. When the adhesive sheet using the electrically conductive paste 12 shown in FIG. 2-(b) is used as the adhesive sheets 26 and 30, the resin (adhesive sheets 26, 30 and the adhesive paste 34) is cured by heating at 150° C. doc for 1.5 hours. Thereby, the core substrate 22 and the built-up layers 24 are joined by the adhesive sheets 26, which form the built-up substrate 20, and, simultaneously, the semiconductor chips 28 are joined to the built-up substrate 20 by the adhesive sheets 30. Also, simultaneously, the heat spreaders 32 are joined to the semiconductor chips 28 by the adhesive paste 34.

When performing the above-mentioned heating, portions of the adhesive sheet 26 in which the electrically conductive paste 12 is provided are in contact with the electrodes 24a of the built-up layer 24, and the electrodes 24a are joined by the electrically conductive material 12 and portions other than the electrodes 24a are joined by the insulating resin. When the electrically conductive paste 12 is cured, the solder covering the surfaces of the metal particles in the electrically conductive paste 12 is melted by heat and is diffused into the base resin. The electrically conductive paste 12 after being cured provides excellent electric conductivity due to the diffused solder.

Similarly, the portion of each adhesive sheet 30 in which the electrically conductive paste 12 is provided is in contact with the electrodes 28a of the semiconductor chip 28, and the electrodes 28a are joined by the electrically conductive paste 12. Portions of the semiconductor chip 28 other than the electrodes 28a are joined by the insulating resin. When the electrically conductive paste 12 us cured, the solder covering the surfaces of the metal particles in the electrically conductive paste 12 is melted by heat and diffused into the base resin. The electrically conductive paste 12 exhibits excellent electric conductivity due to the diffused solder. Since the portions other than the electrodes 28a are joined by the insulating resin, the insulating resin provides the same function as a conventional under-fill. Accordingly, in the present embodiment, the conventional process of curing an under-fill by heat is simultaneously performed with the process of joining the electrodes of the semiconductor chip 28.

After the cure of the resin is completed, chip parts 42 such as a capacitor chip and a resistor chip are mounted onto the built-up substrate 20 as shown in FIG. 4, and the multi-chip module 40 is completed. It should be noted that the chip parts 42 are not always needed, and if they are not needed, the multi-chip module is completed when the process shown in FIG. 3-(*b*) is completed. Additionally, when mounting the chip parts 42, protruding electrodes may be formed by solder balls as external connection electrodes on the backside of the built-up substrate 20.

As mentioned above, in the present embodiment, the formation of the built-up substrate 20, the mount of the semiconductor chips 28, and the joint of the heat spreader 32 are performed simultaneously in the single heating process. Thus, a number of processes relating to the manufacture of the multi-chip module can be reduced, and a manufacturing cost of the multi-chip module can be reduced correspondingly.

It should be noted that although the heat spreader 32 is joined to the semiconductor chips 28, if the semiconductor chips 28 do not generate a large amount of heat, there is no need to provide the heat spreader 32. In such a case, there is no need to arrange the heat spreader 32 on the semiconductor chips 28 in the process shown in FIG. 3-(*b*), and the semiconductor chips 28 are the uppermost part.

In the present embodiment, the adhesive sheet 26 which is the first resin material for forming the built-up substrate 20 and the adhesive sheet 30 which is the second resin material for mounting the semiconductor chips 28 are formed by the same resin and the same electrically conductive paste so that they can be cured in the same heating condition. However, there is no need to use the same material, and different resins or electrically conductive pastes, which can be cured simultaneously in the same heating condition, may be used. For example, a resin suitable for joining the built-up layers 24 may be used for the adhesive sheets 26, and a resin suitable for joining the semiconductor chip 28 may be used for the adhesive sheet 30.

Moreover, as mentioned above, there is no need to make the adhesive paste 34, which is for joining the heat spreader 32 to the semiconductor chips 28, by the same material as the electrically conductive paste 12 used for the adhesive sheets 26 and 30, and any resin paste or resin sheet may be used if it has a good heat transfer performance and can be cured in the same heating process as the adhesive sheets 26 and 30.

However, by forming the adhesive sheets 26 and 30 by the same resin material and the same conductive paste and using the same electrically conductive paste is used for the adhesive paste 34, a parts cost can be reduced by using the common materials, thereby reducing the manufacturing cost of the multi-chip module.

It should be noted that although the multi-chip module having the two semiconductor chips is explained as an example in the above-mentioned embodiment, the number of semiconductor chips is not limited to two. That is, a multi-chip module may have three or more semiconductor chips, or a single-chip module may be formed using a single semiconductor chip.

The present invention is not limited to the specifically disclosed embodiments, and variations and modifications may be made without departing from the scope of the present invention.

The present application is based on Japanese priority application No. 2006-086533 filed Mar. 27, 2006, the entire contents of which are hereby incorporated herein by reference.

What is claimed is:

1. A manufacturing method of a semiconductor device, comprising:

preparing a lamination by positioning a first resin sheet on a circuit-formation layer formed on a substrate, positioning another circuit-formation layer on the first resin sheet that is not cured, repeating the positioning of the circuit-formation layer and the first resin sheet until a desired number of circuit-formation layers are laminated, and, then, positioning a second resin sheet on the uppermost circuit-formation layer, and positioning a semiconductor element on the second resin sheet that is not cured; and heating said lamination to cure the first and second resin sheets simultaneously so that the circuit-formation layers and the semiconductor element are joined simultaneously.

2. The manufacturing method as claimed in claim 1, wherein:

said preparing a lamination includes arranging a heat radiation member on said semiconductor element via a third resin sheet; and said heating said lamination includes curing the third resin sheet simultaneously with the first and second resin sheets.

3. The manufacturing method as claimed in claim 1, including:

forming said first resin sheet by filling an electrically conductive resin in openings formed in an insulating resin of a sheet shape at positions corresponding to electrodes of said circuit-formation layer; and forming said second resin sheet by filling an electrically conductive resin in openings formed in an insulating resin of a sheet shape at positions corresponding to electrodes of said semiconductor element.

4. The manufacturing method as claimed in claim 3, wherein said electrically conductive resin is formed of a base resin and electrically conductive particles dispersed in the base resin, and a metal film is formed on a surface of each of the electrically conductive particles.

5. The manufacturing method as claimed in claim 4, wherein said electrically conductive particles are metal particles, and said metal film is a solder film.

6. The manufacturing method as claimed in claim 1, wherein each of the circuit-formation layers includes electrodes formed on upper and lower surfaces of each of the circuit-formation layers, the electrodes being electrically connected with each other by wirings and vias formed therein.

* * * * *